United States Patent
Miwa et al.

(10) Patent No.: US 10,872,742 B2
(45) Date of Patent: Dec. 22, 2020

(54) CHARGED PARTICLE BEAM DEVICE

(71) Applicant: HITACHI HIGH-TECHNOLOGIES CORPORATION, Tokyo (JP)

(72) Inventors: Takafumi Miwa, Tokyo (JP); Seiichiro Kanno, Tokyo (JP); Go Miya, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 77 days.

(21) Appl. No.: 16/337,791

(22) PCT Filed: Nov. 24, 2016

(86) PCT No.: PCT/JP2016/084744
§ 371 (c)(1),
(2) Date: Mar. 28, 2019

(87) PCT Pub. No.: WO2018/096610
PCT Pub. Date: May 31, 2018

(65) Prior Publication Data
US 2020/0006032 A1  Jan. 2, 2020

(51) Int. Cl.
*H01J 37/09* (2006.01)
*H01J 37/02* (2006.01)
(Continued)

(52) U.S. Cl.
CPC ............ *H01J 37/09* (2013.01); *H01J 37/026* (2013.01); *H01J 37/20* (2013.01); *H01J 37/28* (2013.01);
(Continued)

(58) Field of Classification Search
CPC .... H01J 2237/2007; H01J 37/20; H01J 37/28; H01J 2237/004; H01J 2237/022;
(Continued)

(56) References Cited

U.S. PATENT DOCUMENTS 9,263,313 B2 * 2/2016 Sato .................... H01L 21/6831
9,502,208 B2 * 11/2016 Mizuochi ............... H01J 37/20
(Continued)

FOREIGN PATENT DOCUMENTS

| JP | 2010-033724 A | 2/2010 |
| JP | 2012-064567 A | 3/2012 |
| JP | 2014-082140 A | 5/2014 |
| JP | 2015-176683 A | 10/2015 |

OTHER PUBLICATIONS

International Search Report dated Jan. 13, 2017 of International Application No. PCT/JP2016/084744.

*Primary Examiner* — David A Vanore
(74) *Attorney, Agent, or Firm* — Volpe Koenig (57) ABSTRACT

A charged particle beam device capable of removing a foreign matter adhered to an electric field-correcting electrode arranged in an outer peripheral portion of a measurement sample is provided. The invention is directed to a charged particle beam device including a sample stage provided with the measurement sample and an electric field-correcting electrode correcting an electric field in the vicinity of the outer peripheral portion of the measurement sample and in which the measurement sample is measured by being irradiated with a charged particle beam, wherein a foreign-matter removal control unit controls a power source connected to the electric field-correcting electrode such that an absolute value of a voltage to be applied to the electric field-correcting electrode is equal to or more than an absolute value of a voltage to be applied to the electric field-correcting electrode when the measurement sample is measured.

15 Claims, 8 Drawing Sheets

(51) Int. Cl.
*H01J 37/20* (2006.01)
*H01J 37/28* (2006.01)

(52) U.S. Cl.
CPC . *H01J 2237/0041* (2013.01); *H01J 2237/022* (2013.01)

(58) Field of Classification Search
CPC .. H01J 2237/2817; H01J 37/026; H01J 37/21; H01J 2237/0044; H01J 2237/0047; H01J 2237/028; H01J 2237/06; H01J 2237/14; 2237/20221; H01J 2237/20278; H01J 2237/24495; H01J 2237/24564; H01J 2237/28; H01J 2237/2801; H01J 37/09
USPC ....... 250/440.11, 307, 310, 311, 398, 442.11
See application file for complete search history.

(56) References Cited

U.S. PATENT DOCUMENTS

| | | | |
|---|---|---|---|
| 2002/0114123 A1* | 8/2002 | Nishio | H01J 37/3299 361/234 |
| 2012/0074316 A1* | 3/2012 | Watanabe | H01J 37/29 250/307 |
| 2015/0097123 A1* | 4/2015 | Ebizuka | H02N 13/00 250/440.11 |
| 2015/0262857 A1* | 9/2015 | Ebizuka | H01J 37/28 250/442.11 |
| 2015/0279609 A1* | 10/2015 | Tanii | H01J 37/21 250/398 |
| 2015/0357156 A1* | 12/2015 | Ebizuka | H01J 37/026 250/311 |
| 2016/0013010 A1* | 1/2016 | Kanno | H01J 37/21 250/440.11 |

* cited by examiner

CHARGED PARTICLE BEAM DEVICE

TECHNICAL FIELD

The present invention relates to a charged particle beam device.

BACKGROUND ART

A charged particle beam device such as an electron microscope or an ion microscope is used to observe various samples having fine structures. As one of the charged particle beam device, a scanning electron microscope is applied to measurement that is the pattern dimension measurement or the defect inspection of a semiconductor device formed on a semiconductor wafer as a sample for the purpose of the process management of the semiconductor device.

In such a scanning electron microscope, the pattern of the semiconductor device is measured which is formed up to the outer peripheral portion of the sample. The electric field is distorted at the outer peripheral portion of the sample depending on the structure or the material of a sample stage for holding a sample such as an electrostatic chuck and a sample chamber. When the track of a charged particle beam is bent due to the distortion of the electric field in the outer peripheral portion of the sample, the pattern of the semiconductor device cannot be measured properly in the outer peripheral portion of the sample. With respect to the above-described problem, PTLs 1 and 2 disclose a charged particle beam device in which it is suppressed that the charged particle beam is affected by the distortion of the electric field generated in the vicinity of the outer peripheral portion of the sample. In order to suppress the various electric fields generated in the vicinity of the edge of the sample to affect the beam, PTL 1 discloses an electrostatic chuck mechanism and a charged particle beam device. The electrostatic chuck mechanism includes a first surface serving as the surface on the side where a sample is sucked, and a first electrode applied with a voltage for generating a suction force between the first surface and the sample. The electrostatic chuck mechanism further includes a second electrode which is arranged at a position through which a virtual straight line, perpendicular to the first surface and in contact with the edge of the sample, passes and which is disposed to be relatively separated from the sample compared to the first surface. The first surface is formed so that the size thereof in a plane direction becomes smaller than that of the sample. In order to prevent lowering of resolution by correcting the turbulence of an electric field at a periphery edge portion of a sample to be observed, PTL 2 discloses a sample holder and a charged particle beam device. The sample holder is used for the charged particle beam device which forms an image with secondary signals generated when the sample is irradiated with the charged particle beams. The sample holder includes a plurality of electric field-correcting electrodes provided on the surface where the sample is placed, and retarding voltage-applying cables that apply retarding voltages to the sample to make speed of the charged particle beams slow down. The voltages to be applied to the electric field-correcting electrodes are adjusted based on the image of the sample.

In order not to reduce the yield of the semiconductor device, in the charged particle beam device for the measurement of the pattern of the semiconductor device, the device is required to be managed so as not to generate a foreign matter in a sample to be measured. For this reason, PTL 3 discloses the charged particle beam device and a method thereof in which management is performed such that the foreign matter is not generated in the sample. In PTL 3, a method is proposed in which a magnetic field equal to or more than that applied at a normal use is applied to an objective lens, and an electric field equal to or more than that applied at a normal use is applied to an electrode arranged at the periphery of the objective lens, whereby foreign matters in a sample chamber are to be adhered to the objective lens and the electrode arranged at the periphery of the objective lens or to be attracted to the periphery. Specifically, a stage is moved so that the center of an optical axis is immediately above a dedicated table that can be applied with a voltage, and after the magnetic field of the objective lens is turned off, a potential difference between the electrode arranged at the periphery of the objective lens and the electrode arranged at the periphery of the stage is maximized and minimized periodically, whereby, the foreign matters are forcibly to be dropped on the dedicated table that can be applied with a voltage.

CITATION LIST

Patent Literature

PTL 1: JP-A-2015-176683
PTL 2: JP-A-2010-033724
PTL 3: JP-A-2014-082140

SUMMARY OF INVENTION

Technical Problem

As described in PTLs 1 and 2, in order to suppress the distortion of the electric field in the outer peripheral portion of the sample in the charged particle beam device, the electric field-correcting electrode is necessarily provided in the outer peripheral portion of the sample to correct the distortion of the electric field corresponding to the position to be measured. However, as a result of the examination by the inventor or the like, it is found that the foreign matter adheres to the electric field-correcting electrode by the change of the electric field-correcting electrode corresponding to the position to be measured and the potential gradient in the vicinity thereof. When the foreign matter adhering to the electric field-correcting electrode is scattered, since the foreign matter adheres to the sample to be measured, it is necessary to remove the foreign matter adhering to the electric field-correcting electrode. In this regard, the inventor or the like has examined the method described in PTL 3 for removing the foreign matter adhering to the electric field-correcting electrode. However, in PTL 3, it is not assumed that the electric field-correcting electrode is provided and it is found that the foreign matter adhering to the electric field-correcting electrode cannot be removed even when the method described in PTL 3 is simply applied as it is.

An object of the invention is to provide a charged particle beam device in which a foreign matter adhering to an electric field-correcting electrode arranged in an outer peripheral portion of a sample can be removed.

Solution to Problem

As one embodiment for achieving the object described above, a charged particle beam device which includes a sample stage provided with a measurement sample and an electric field-correcting electrode which corrects an electric field in a vicinity of an outer peripheral portion of the measurement sample, and in which the measurement sample is measured by irradiating the measurement sample with a charged particle beam, the device including:

a foreign-matter removal control unit which performs control such that when a dummy sample is provided in the sample stage or both the measurement sample and the dummy sample are not provided in the sample stage, a first voltage is applied to the electric field-correcting electrode and/or a second voltage is applied to a neighboring electrode arranged near the electric field-correcting electrode to remove a foreign matter adhering to the electric field-correcting electrode, wherein the foreign-matter removal control unit controls a power source connected to the electric field-correcting electrode and/or a power source connected to the neighboring electrode such that in the voltage to be applied to the electric field-correcting electrode, the first voltage and/or the second voltage have periodicity, or an absolute value of the first voltage and/or an absolute value of the second voltage is equal to or more than an absolute value of the voltage applied when the measurement sample is measured.

As another embodiment, a charged particle beam device including:

a charged particle gun;

a sample stage which is provided with a measurement sample to be irradiated with a charged particle beam including a charged particle emitted from the charged particle gun;

an electric field-correcting electrode which is arranged in a periphery of the sample stage and corrects an electric field in a vicinity of an outer peripheral portion of the measurement sample;

a charged particle beam optical system for the charged particle beam which includes an objective lens;

a control unit which controls each component; and a display unit which is connected to the control unit, wherein the display unit displays a time change of a voltage having periodicity and to be applied to the electric field-correcting electrode when the foreign matter adhering to the electric field-correcting electrode is removed, or a time change of an absolute value of a voltage which is equal to or more than an absolute value of a voltage to be applied when the measurement sample is measured.

As another embodiment, a charged particle beam device including:

a charged particle gun;

a sample stage which is provided with a measurement sample to be irradiated with a charged particle beam including a charged particle emitted from the charged particle gun;

an electric field-correcting electrode which is arranged in a periphery of the sample stage;

a charged particle beam optical system for the charged particle beam which includes an objective lens;

a control unit which controls each component; and a display unit which is connected to the control unit, wherein the display unit displays a time change of a voltage having periodicity and to be applied to an electrode in the vicinity of the electric field-correcting electrode when the foreign matter adhering to the electric field-correcting electrode is removed, or a time change of an absolute value of a voltage which is equal to or more than an absolute value of a voltage to be applied when the measurement sample is measured.

Advantageous Effects of Invention

According to the invention, it is possible to provide the charged particle beam device in which the foreign matter adhering to the electric field-correcting electrode arranged in the outer peripheral portion of the sample can be removed.

The problems, configurations, and effects other than those described above will become apparent from the following description of embodiments.

DESCRIPTION OF EMBODIMENTS

The inventor or the like has examined a method of removing a foreign matter adhering to an electric field-correcting electrode. As a result, it is found that when the sample which is not a measurement target is provided in a sample stage, or the sample is not provided, the foreign matter adhering to the electric field-correcting electrode is removed by applying the voltage which is an absolute value equal to or more than the absolute value of the applied voltage during measurement or the voltage having periodicity to the electric field-correcting electrode or the electrode in the vicinity thereof. The invention has been made based on new findings including problems.

Hereinafter, the embodiment which is applied to a scanning electron microscope used for observation, inspection, and measurement is described as one example of a charged particle beam device to which the invention is applied. However, the invention can be applied to a focused ion beam system in which observation or the like by using an ion beam as well as an electron beam is performed.

Incidentally, the invention is not limited to the following embodiments and may include various modifications. For example, the following embodiments are intended to be illustrative of the invention in an easily understandable manner, and the invention is not limited to necessarily include all of the components described in the embodiments. In addition, a part of the configuration of one embodiment can be substituted with the configuration of another embodiment or the configuration of another embodiment may be added to the configuration of one embodiment. In addition, another configuration can be added, deleted, or replaced for a part of the configuration of each embodiment.

First Embodiment

A charged particle beam device according to a first embodiment and the configuration in which the foreign matter adhering to the electric field-correcting electrode is removed are described with reference to FIGS. 1, 2, and 3.

Figure 1:
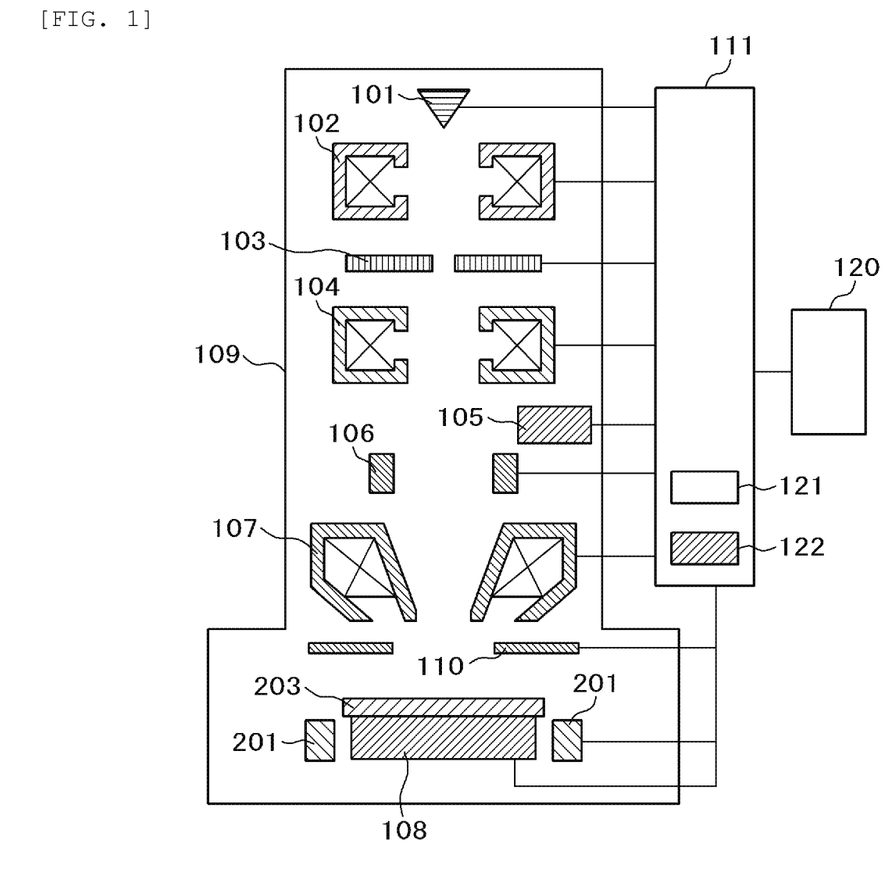
FIG. 1 is a configurational sectional view (partial block diagram) schematically illustrating one example of a charged particle beam device (scanning electron microscope) according to a first embodiment of the invention.

FIG. 1 is an overall configurational sectional view (partial block diagram) schematically illustrating the charged particle beam device of this embodiment. A primary electron beam from an electron gun 101 provided in a casing 109 passes through a first condenser lens 102, a aperture 103, a second condenser lens 104, a scanning deflector 106, an objective lens 107, a shield electrode 110, and the like to be converged and deflected, and is radiated to the measurement position of a sample (hereinafter, referred to as a measurement sample) for observation, inspection, and measurement which is held on a sample stage 108.

Apart of a secondary electron which is emitted from the measurement sample by the radiation of the primary electron beam reaches a detector 105. By the secondary electron signal detected in the detector 105, the image is formed, and a measurement such as a dimension measurement or a defect inspection of the measurement sample can be performed. The shield electrode 110 is provided to suppress distortion of the electric field in the entire surface of the measurement sample and suppress that the track of the primary electron beam is bent during the measurement of the measurement sample. In addition, an electric field-correcting electrode 201 is provided to suppress the distortion of the electric field in the outer peripheral portion of the measurement sample.

Such operation that a voltage is applied to the configurations of the charged particle beam device such as the electron gun 101, the first condenser lens 102, the aperture 103, the second condenser lens 104, the scanning deflector 106, the objective lens 107, the shield electrode 110, the sample stage 108, and the electric field-correcting electrode 201 are controlled by a control unit 111. The casing 109 is exhausted by a vacuum pump (not illustrated). Reference sign 120 indicates a data input/output unit including a display unit. The display unit can be arranged as a separate body separated from the data input/output unit. Reference sign 121 indicates a storage unit, and reference sign 122 indicates a foreign-matter removal control unit. Incidentally, FIG. 1 illustrates a state where a sample 203 (hereinafter, referred to as a dummy sample) which is used to remove a foreign matter adhering to the electric field-correcting electrode and is not a measurement target is placed on the sample stage 108 as well as the measurement sample.

Figure 2:
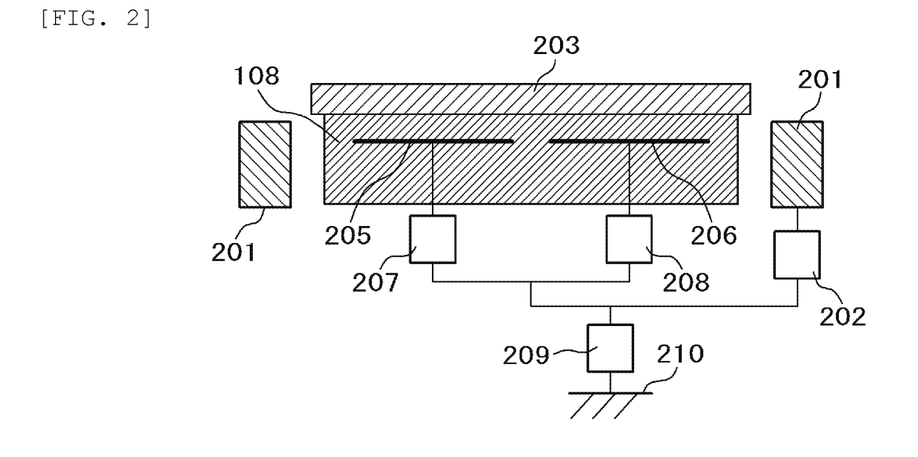
FIG. 2 is an enlarged sectional view of an electric field-correcting electrode and a vicinity thereof in the charged particle beam device illustrated in FIG. 1.

FIG. 2 is an enlarged sectional view of components including the electric field-correcting electrode 201 illustrated in FIG. 1 and the sample stage 108 in the vicinity thereof. For example, in this embodiment, the sample which is held by the sample stage 108 is a measurement sample such as the semiconductor wafer or the dummy sample 203. In addition, the sample stage 108 includes a disc made of high-resistance alumina, and an electrostatic chuck electrode 205 and an electrostatic chuck electrode 206 arranged therein. An electrostatic chuck power source 207 and an electrostatic chuck power source 208 for applying a voltage are connected to the electrostatic chuck electrodes 205 and 206, respectively, and configure a bipolar electrostatic chuck.

Further, the circular electric field-correcting electrode 201 in which an electric field-correcting power source 202 for applying electric field correction voltage is connected is arranged in the outer peripheral portion of the electrostatic chuck. The electric field-correcting electrode is not required to be integrated and may be configured to be a composite of a plurality of members. All of the electrostatic chuck power source 207, the electrostatic chuck power source 208, and the electric field-correcting power source 202 are connected to a retarding power source 209 for applying a retarding voltage. A retarding potential corresponding to a retarding voltage is superimposed with each of the electrostatic chuck electrode 205, the electrostatic chuck electrode 206, the electric field-correcting electrode 201, and the measurement sample or the dummy sample 203. A so-called retarding method can be applied in which the primary electron beam is accelerated with a high accelerating voltage by the retarding potential to reduce irradiation energy just before the radiation to the measurement sample. The retarding power source 209 is connected to a ground 210.

Figure 3:
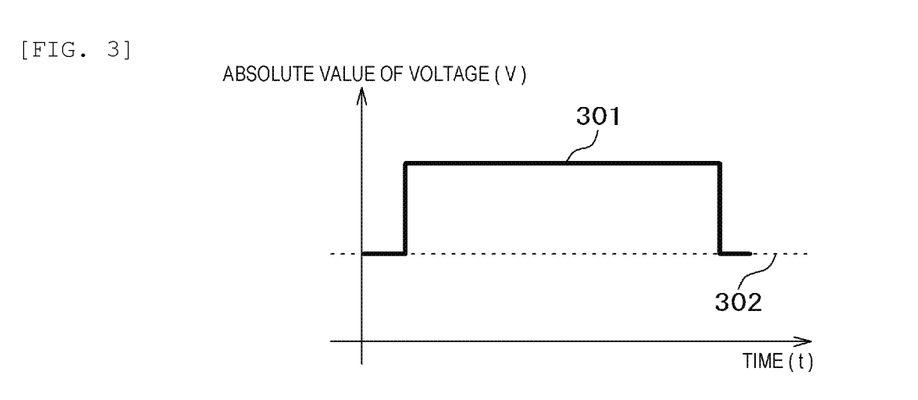
FIG. 3 is an explanatory diagram illustrating a time change of an absolute value of the voltage to be applied to the electric field-correcting electrode when a foreign matter is removed from the electric field-correcting electrode illustrated in FIG. 2.

FIG. 3 is an explanatory diagram illustrating a time change of an absolute value 301 of the voltage to be applied to the electric field-correcting electrode 201 when the foreign matter illustrated in FIG. 2 is removed from the electric field-correcting electrode. In the configuration of FIG. 2, the voltage is applied to the electric field-correcting electrode 201. When the potential gradient is formed by applying a voltage, a force such as the Coulomb force or a dielectrophoretic force may act on the foreign matter, so that the foreign matter is scattered. Herein, as illustrated in FIG. 3, the absolute value 301 of the voltage applied to the electric field-correcting electrode 201 is equal to or more than a maximum value 302 of the absolute value of the voltage applied to the electric field-correcting electrode 201 during the measurement. Further, it is desirable to exceed the maximum value. The voltage can be set by an input/output unit 120 including the display unit. In addition, the voltage may be registered in the storage unit 121 in advance. In addition, the maximum value of the absolute value of the voltage applied to the electric field-correcting electrode during the measurement may be recorded, and a voltage value obtained by adding a predetermined voltage to the value may be calculated and set in the control unit 111. In addition, the time change of the absolute value 301 of the voltage applied to the electric field-correcting electrode 201 which corresponds to FIG. 3 may be displayed on the display unit of the input/output unit 120. In addition, a displaying target may be a voltage value having a polarity as well as the absolute value.

When the power source (the electric field-correcting power source 202 or the retarding power source 209) is controlled by the foreign-matter removal control unit 122 such that such a voltage is applied to the electric field-correcting electrode 201, the potential gradient of the electric field-correcting electrode and the neighboring electrode at the time of removing the foreign matter becomes larger than the potential gradient of the electric field-correcting electrode and the neighboring electrode at the time of measuring the sample, and the foreign matter which is not scattered from the electric field-correcting electrode 201 during the measurement is scattered from the electric field-correcting electrode 201 to adhere to the dummy sample 203. Accordingly, the foreign matter adhering to the electric field-correcting electrode 201 is removed. Thus, when the measurement sample is measured after the dummy sample 203 is carried out, although the applied voltage is changed according to the measurement position, it can be suppressed that the foreign matter is scattered from the electric field-correcting electrode 201.

According to this embodiment, the charged particle beam device can be provided in which the foreign matter adhering to the electric field-correcting electrode arranged on the outer peripheral portion of the sample can be removed. Accordingly, it can be suppressed that the foreign matter adheres to the measurement sample due to the electric field-correcting electrode.

In this embodiment, the embodiment is described to have the configuration in which the electrostatic chuck is included in the sample stage 108. However, the invention is not limited to the configuration in which the electrostatic chuck is included. For example, the invention may be similarly applied to a holder-type sample stage which includes the electric field-correcting electrode in the outer peripheral portion of the sample. In addition, the electrostatic chuck may be configured of a material other than the high-resistance alumina. Further, the electrostatic chuck is not necessarily configured to be a hyperbolic type with two electrostatic chuck electrodes and may be configured to include one electrostatic chuck electrode or three or more electrostatic chuck electrodes. Further, the retarding power source 209 may not be provided in a case where the retarding potential is not required to be superimposed. In addition, a configuration may be made in which the sample is set to the retarding potential by bringing a contact connected to the retarding power source 209 into contact.

Second Embodiment

The description will be given about a charged particle beam device according to a second embodiment of the invention. Incidentally, the matters which are described in the first embodiment and are not described in this embodiment may also be applied to this embodiment unless there are special circumstances.

Figure 4:
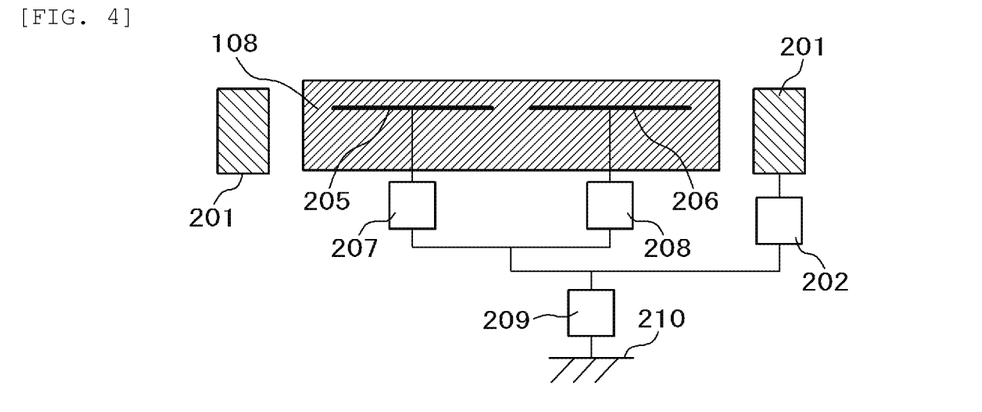
FIG. 4 is an enlarged sectional view of the electric field-correcting electrode and the vicinity thereof in a charged particle beam device according to a second embodiment of the invention.

In this embodiment, the description will be given about the configuration in which the foreign matter adhering to the electric field-correcting electrode is removed without using the dummy sample as well as the measurement sample. FIG. 4 is an enlarged sectional view of components including the electric field-correcting electrode 201 and the sample stage 108 in the vicinity thereof in this embodiment. Incidentally, in FIG. 4, the same reference signs as those of FIG. 2 indicate the same or corresponding parts. Thus, the repetitive description thereof is not given. In the first embodiment, the dummy sample 203 is held by the sample stage. However, in this embodiment, a change is made compared to the first embodiment in that the dummy sample is not held by the sample stage.

In this embodiment, in the configuration illustrated in FIG. 4, in order to remove the foreign matter, the power source (the electric field-correcting power source 202 or the retarding power source 209) is controlled by the foreign-matter removal control unit 122 such that the voltage is applied to the electric field-correcting electrode 201. Herein, as the first embodiment is illustrated in FIG. 3, the absolute value 301 of the voltage applied to the electric field-correcting electrode 201 is equal to or more than the maximum value 302 of the absolute value of the voltage which is applied to the electric field-correcting electrode 201 during the measurement. Further, it is desirable to exceed the maximum value. The voltage can be set by the input/output unit 120 including the display unit. In addition, the voltage may be registered in the storage unit 121 in advance. In addition, the maximum value of the absolute value of the voltage applied to the electric field-correcting electrode during the measurement may be recorded, and a voltage value obtained by adding a predetermined voltage to the value may be calculated and set in the control unit 111. In addition, the time change of the absolute value 301 of the voltage applied to the electric field-correcting electrode 201 which corresponds to FIG. 3 may be displayed on the display unit of the input/output unit 120. In addition, the displaying target may be a voltage value having a polarity as well as the absolute value.

In the first embodiment, the foreign matter removed from the electric field-correcting electrode 201 adheres to the dummy sample 203. When the foreign matter adheres, the dummy sample 203 can be the source of the foreign matter. Thus, in some cases, the dummy sample cannot be used when the foreign matter is removed again, and a new dummy sample 203 is necessarily used each time the foreign matter is removed from the electric field-correcting electrode 201. According to this embodiment, there is an advantage that the new dummy sample 203 is not required to be used, and a running cost can be reduced.

According to this embodiment, the same effect as the first embodiment can be obtained. In addition, the dummy sample is not required, and the running cost can be reduced.

Third Embodiment

The description will be given about a charged particle beam device according to a third embodiment of the invention. Incidentally, the matters which are described in the first and second embodiments and are not described in this embodiment may also be applied to this embodiment unless there are special circumstances.

Figure 5:
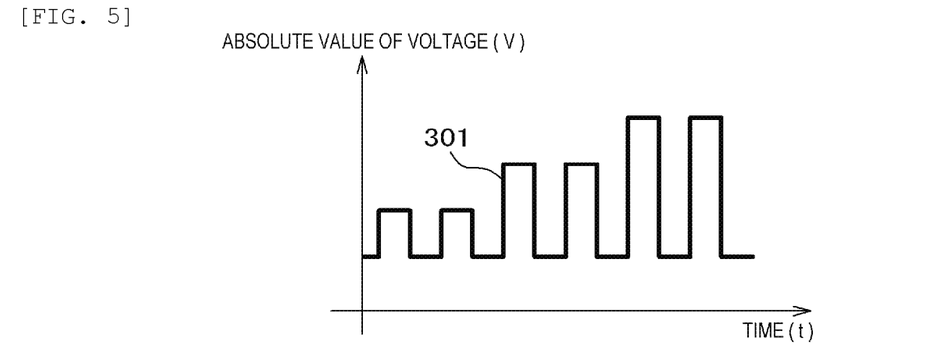
FIG. 5 is an explanatory diagram illustrating a time change of an absolute value of the voltage to be applied to the electric field-correcting electrode when the foreign matter is removed from the electric field-correcting electrode in a charged particle beam device according to a third embodiment of the invention.

In this embodiment, the description will be given about the configuration in which the foreign matter adhered to the electric field-correcting electrode is removed effectively. Similarly to the first embodiment, the entire configuration is made such that an enlarged sectional view of the components including the electric field-correcting electrode 201 and the sample stage 108 in the vicinity thereof is as illustrated in FIG. 2. The same reference signs as those of the view referred to in the first embodiment indicate the same or corresponding parts. Thus, the repetitive description thereof is not given. FIG. 5 is an explanatory diagram illustrating a time change of an absolute value 301 of the voltage to be applied to the electric field-correcting electrode 201 when the foreign matter is removed in this embodiment. In the first embodiment, when the foreign matter is removed, the absolute value 301 of the voltage applied to the electric field-correcting electrode 201 is necessarily equal to or more than the maximum value 302 of the absolute value of the voltage applied to the electric field-correcting electrode 201 during the measurement. However, in this embodiment, the point of modification compared to the first embodiment is that the absolute value 301 of the voltage applied to the electric field-correcting electrode 201 is changed periodically when the foreign matter is removed.

In this embodiment, in the configuration illustrated in FIG. 2, in order to remove the foreign matter, the power source (the electric field-correcting power source 202 or the retarding power source 209) is controlled by the foreign-matter removal control unit 122 such that the voltage is applied to the electric field-correcting electrode 201. Herein, as illustrated in FIG. 5, the voltage applied to the electric field-correcting electrode 201 is a voltage having periodicity. The periodicity is any one of both of temporal periodicity and periodicity in which the absolute value of the voltage is increased in stages. The applied voltage and the period can be set by the input/output unit 120 including the display unit. In addition, the voltage may be registered in the storage unit 121 in advance. In addition, the time change of the absolute value 301 of the voltage applied to the electric field-correcting electrode 201 which corresponds to FIG. 5 may be displayed on the display unit of the input/output unit 120. In addition, the displaying target may be a voltage value having a polarity as well as the absolute value.

In the change of the potential gradient of the electric field-correcting electrode 201 and the vicinity thereof which is caused by one voltage application, the foreign matter which is not scattered from the electric field-correcting electrode 201 can be scattered and removed by applying the voltage having the periodicity to the electric field-correcting electrode 201. For this reason, in this embodiment, there is an advantage that the foreign matter can be removed effectively.

According to this embodiment, the same effect as the first embodiment can be obtained. In addition, when the absolute value of the voltage applied to the electric field-correcting electrode is changed periodically, the foreign matter can be removed more effectively from the electric field-correcting electrode.

Fourth Embodiment

The description will be given about a charged particle beam device according to a fourth embodiment of the invention. Incidentally, the matters which are described in the first to third embodiments and are not described in this embodiment may also be applied to this embodiment unless there are special circumstances.

Figure 6:
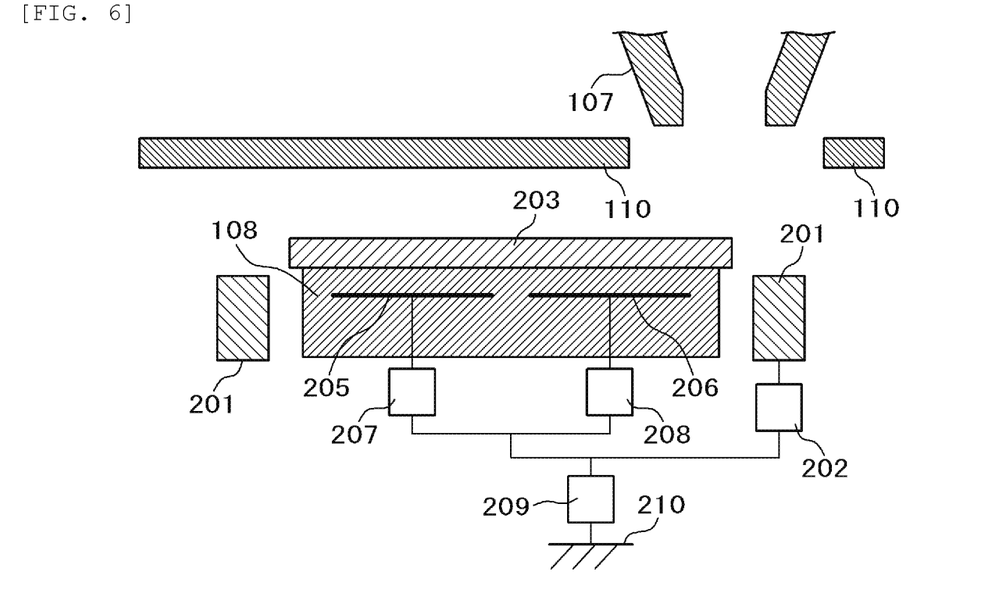
FIG. 6 is an enlarged sectional view of the electric field-correcting electrode and the vicinity thereof in a charged particle beam device according to a fourth embodiment of the invention.
Figure 7:
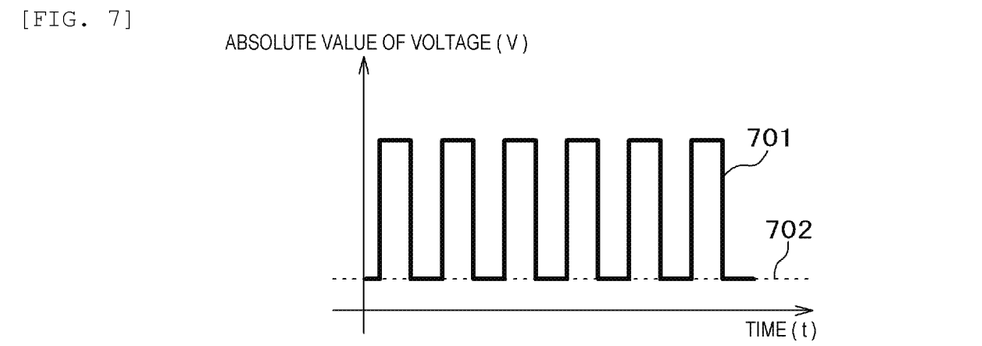
FIG. 7 is an explanatory diagram illustrating a time change of an absolute value of the voltage to be applied to the electrode in the vicinity of the electric field-correcting electrode when the foreign matter is removed from the electric field-correcting electrode illustrated in FIG. 6.

In this embodiment, the description will be given about another configuration in which the foreign matter adhered to the electric field-correcting electrode is removed effectively. FIG. 6 is an enlarged sectional view of the components including the electric field-correcting electrode 201 and the sample stage 108 in the vicinity thereof in this embodiment. Incidentally, in FIG. 6, the same reference signs as those in FIG. 2 indicate the same or corresponding parts. Thus, the repetitive description thereof is not given. Unlike the first embodiment to the third embodiment, the point of modification is that the sample stage 108 and the electric field-correcting electrode 201 are moved such that the objective lens 107 and the shield electrode 110 are arranged in the vicinity of the electric field-correcting electrode 201. FIG. 7 is an explanatory diagram illustrating a time change of an absolute value 701 of the voltage to be applied to the electrode in the vicinity of the electric field-correcting electrode 201 in this embodiment.

In this embodiment, in the configuration illustrated in FIG. 6, in order to remove the foreign matter, the power source connected to the electrode in the vicinity of the electric field-correcting electrode 201 is controlled by the foreign-matter removal control unit 122 such that the voltage is applied to the electrode in the vicinity of the electric field-correcting electrode 201. As illustrated in FIG. 7, the time change of the absolute value 701 of the voltage applied to the electrode in the vicinity of the electric field-correcting electrode 201 is periodical, and the value thereof is equal to or more than the maximum value 702 of the absolute value of the voltage applied to the electrode in the vicinity of the electric field-correcting electrode 201 during the measurement. Further, it is desirable to exceed the maximum value. The applied voltage and the period can be set by the input/output unit 120 including the display unit. In addition, the voltage may be registered in the storage unit 121 in advance. In addition, with respect to the applied voltage, the maximum value of the absolute value of the voltage applied to the electrode in the vicinity of the electric field-correcting electrode during the measurement may be recorded, and a voltage value obtained by adding a predetermined voltage to the value may be calculated and set in the control unit 111. In addition, the time change of the absolute value 301 of the voltage applied to the electrode in the vicinity of the electric field-correcting electrode 201 which corresponds to FIG. 7 may be displayed on the display unit of the input/output unit 120. In addition, the displaying target may be a voltage value having a polarity as well as the absolute value.

Herein, the neighboring electrode of the electric field-correcting electrode 201 is at least one of the dummy sample 203, the objective lens 107, the electrostatic chuck electrode 205, the electrostatic chuck electrode 206, and the shield electrode 110. In the power source for applying a voltage to the neighboring electrode, the range of the applied voltage is larger than that of the electric field-correcting power source 202, and the power source is one or more power sources of the electrostatic chuck power source 207, the electrostatic chuck power source 208, the retarding power source 209, and the respective power sources connected to the objective lens (not illustrated), or all of the power sources.

Incidentally, in this embodiment, the absolute value 701 of the voltage applied to the electrode in the vicinity of the electric field-correcting electrode 201 is set to be equal to or more than the maximum value 702 of the absolute value of the voltage applied to the electrode in the vicinity of the electric field-correcting electrode 201 during the measurement. However, in a case where the applied voltage has the periodicity as in this embodiments, the effect of removing the foreign matter adhering to the electric field-correcting electrode can be obtained although the absolute value is equal to or less than the maximum value 702 of the absolute value of the voltage applied to the electrode in the vicinity of the electric field-correcting electrode 201 during the measurement. However, the effect of removing the foreign matter is increased as the voltage becomes higher, and the voltage applied to the electrode in the vicinity of the electric field-correcting electrode 201 during the measurement is desirably set to be equal to or more than the maximum value 702 of the absolute value.

In the first embodiment, in some cases, the potential gradient formed in the vicinity of the electric field-correcting electrode 201 cannot be made sufficiently large only by applying a voltage to the electric field-correcting electrode 201 from the electric field-correcting power source 202. When the potential gradient formed in the vicinity of the electric field-correcting electrode 201 is made sufficiently large, the foreign matter is easily scattered and removed from the electric field-correcting electrode 201. According to this embodiment, the potential gradient formed in the vicinity of the electric field-correcting electrode 201 can be increased by using a power source different from the electric field-correcting power source 202 to effectively remove the foreign matter adhered to the electric field-correcting electrode.

Incidentally, this embodiment can be similarly applied even to the configuration in which the objective lens 107 and the shield electrode 110 are not arranged in the vicinity of the electric field-correcting electrode 201.

According to this embodiment, the same effect as that of the first embodiment can be obtained. In addition, when the electrode is arranged in the vicinity of the electric field-correcting electrode, and the voltage is applied to the neighboring electrode, the foreign matter can be removed more effectively from the electric field-correcting electrode.

Fifth Embodiment

The description will be given about a charged particle beam device according to a fifth embodiment of the invention. Incidentally, the matters which are described in the first to fourth embodiments and are not described in this embodiment may also be applied to this embodiment unless there are special circumstances.

Figure 8:
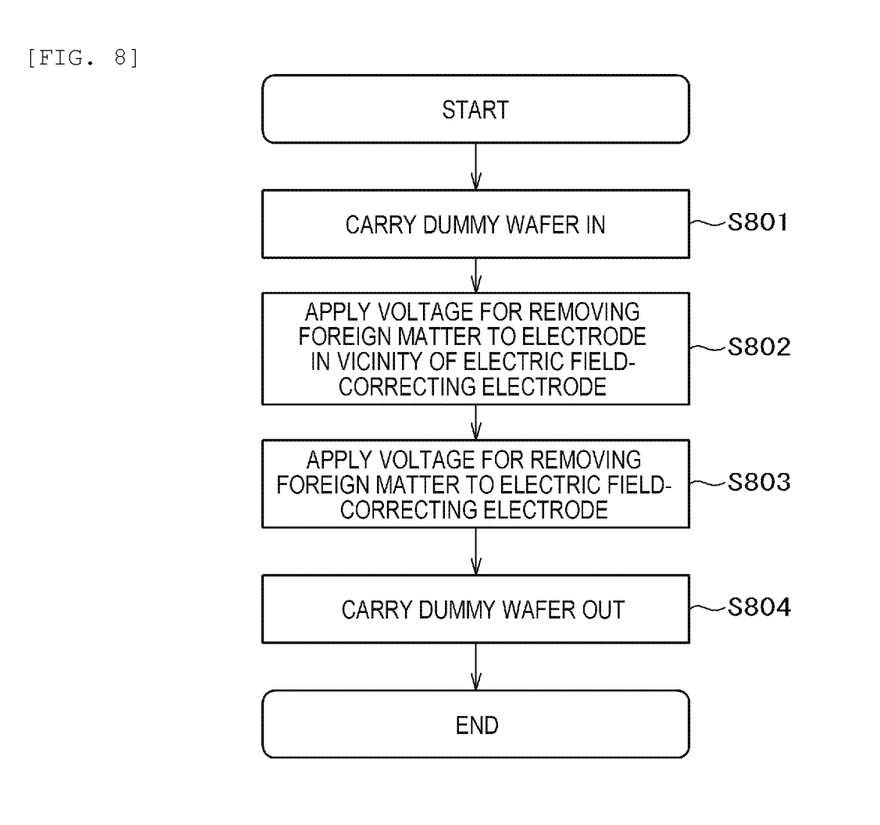
FIG. 8 is a flowchart showing a process of removing the foreign matter from the electric field-correcting electrode in the charged particle beam device according to a fifth embodiment of the invention.

In this embodiment, the description will be given about the configuration in which the foreign matter adhering to the electric field-correcting electrode is removed effectively. The configuration which includes the electric field-correcting electrode 201 and the sample stage 108 in the vicinity thereof in this embodiment is the same as the configuration illustrated in FIG. 6. The same reference signs as those of the view referred to in the first to fourth embodiments indicate the same or corresponding parts. Thus, the repetitive description thereof is not given. FIG. 8 is a flowchart showing a process of removing the foreign matter from the electric field-correcting electrode in this embodiment.

The dummy sample (dummy wafer) 203 is carried in on the sample stage (step S801). Next, the voltage for removing the foreign matter is applied to the electrode in the vicinity of the electric field-correcting electrode 201 (step S802). Next, the voltage for removing the foreign matter is applied to the electric field-correcting electrode 201 (step S803). Herein, as illustrated in FIG. 7, the time change of the absolute value 701 of the voltage applied to the electrode in the vicinity of the electric field-correcting electrode 201 is periodical, and the value thereof is equal to or more than the maximum value 702 of the absolute value of the voltage applied to the electrode in the vicinity of the electric field-correcting electrode 201 during the measurement. In addition, as illustrated in FIG. 3, the absolute value 301 of the voltage applied to the electric field-correcting electrode 201 is equal to or more than the maximum value 302 of the absolute value of the voltage applied to the electric field-correcting electrode 201 during the measurement. Further, it is desirable to exceed respective maximum values.

Thereafter, the dummy sample 203 is carried out (step S804). Incidentally, the voltage can be applied to the electrode in the vicinity of the electric field-correcting electrode for removing the foreign matter adhering to the electric field-correcting electrode 201 or the electric field-correcting electrode when the power source connected to each electrode is controlled by the foreign-matter removal control unit 122.

In some cases, the foreign matter adheres to the electrode in the vicinity of the electric field-correcting electrode 201. Particularly, a lot of foreign matters having magnetism may adhere to the objective lens forming a magnetic field. For this reason, in the fourth embodiment, the potential gradient near the electrode in the vicinity of the electric field-correcting electrode 201 may be changed largely by the change of the voltage applied to the electrode in the vicinity of the electric field-correcting electrode 201, and the foreign matter scattered from the electrode in the vicinity of the electric field-correcting electrode 201 may adhere to the electric field-correcting electrode 201. According to this embodiment, although the foreign matter adhering to the electrode in the vicinity of the electric field-correcting electrode 201 is scattered and then adheres to the electric field-correcting electrode 201, the foreign matter adhering to the electric field-correcting electrode 201 is removed thereafter, and thus the effect of removing the foreign matter from the electric field-correcting electrode 201 is increased, which is advantageous.

According to this embodiment, the same effect as that of the first embodiment can be obtained. In addition, after the electrode is arranged in the vicinity of the electric field-correcting electrode, and the voltage is applied to the neighboring electrode, the voltage is applied to the electric field-correcting electrode, so that the foreign matter can be removed more effectively from the electric field-correcting electrode.

Sixth Embodiment

The description will be given about a charged particle beam device according to a sixth embodiment of the invention. Incidentally, the matters which are described in the first to fifth embodiments and are not described in this embodiment may also be applied to this embodiment unless there are special circumstances.

Figure 9:
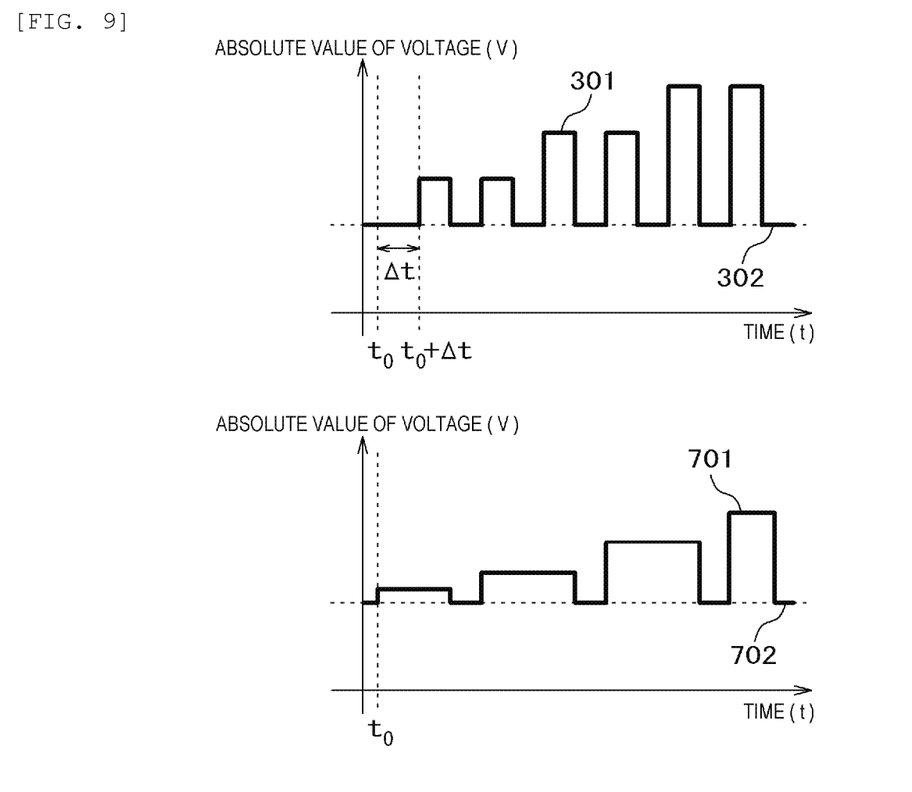
FIG. 9 is an explanatory diagram illustrating a time change of an absolute value of the voltage to be applied to the electric field-correcting electrode and the electrode in the vicinity thereof when the foreign matter is removed from the electric field-correcting electrode in a charged particle beam device according to a sixth embodiment of the invention.
Figure 10:
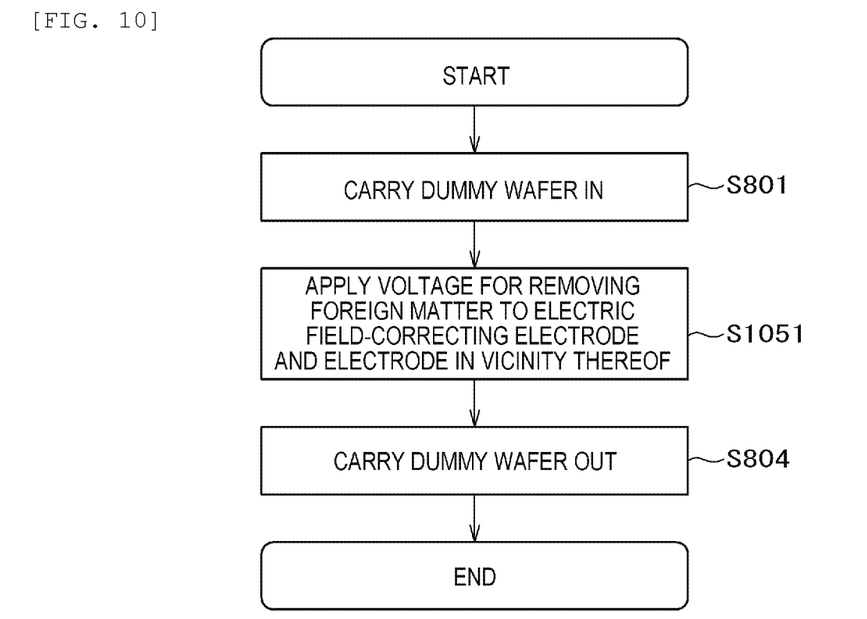
FIG. 10 is a flowchart showing a process of removing the foreign matter from the electric field-correcting electrode in the charged particle beam device according to the sixth embodiment of the invention.

In this embodiment, the description will be given about the configuration in which the foreign matter adhering to the electric field-correcting electrode is removed effectively. The configuration including the electric field-correcting electrode 201 and the sample stage 108 in the vicinity thereof in this embodiment is the same as the configuration illustrated in FIG. 6. The same reference signs as those of the view referred to in the first to fifth embodiments indicate the same or corresponding parts. Thus, the repetitive description thereof is not given. FIG. 9 is an explanatory diagram illustrating a time change of the absolute value 301 of the voltage to be applied to the electric field-correcting electrode 201 and the absolute value 701 of the voltage applied to the electrode in the vicinity of the electric field-correcting electrode 201 in this embodiment. FIG. 10 is a flowchart showing a process of removing the foreign matter from the electric field-correcting electrode in this embodiment. In this embodiment, the point of modification compared to the fifth embodiment is that the time change of the absolute value 301 of the voltage applied to the electric field-correcting electrode 201 and the time change of the absolute value 701 of the voltage applied to the electrode in the vicinity of the electric field-correcting electrode 201 are synchronized.

As illustrated in FIG. 10, first, the dummy sample (dummy wafer) 203 is carried in on the sample stage (step S801). Next, the voltage for removing the foreign matter is applied to each of the electric field-correcting electrode 201 and the electrode in the vicinity of the electric field-correcting electrode 201 (step S1051). Herein, the absolute value 301 of the voltage applied to the electric field-correcting electrode 201 and the absolute value 701 of the voltage applied to the electrode in the vicinity of the electric field-correcting electrode 201 are changed synchronously.

In a detail example, as illustrated in FIG. 9, the absolute value 701 of the voltage applied to the electrode in the vicinity of the electric field-correcting electrode 201 is changed after the time delayed by Δt from time t0 when the absolute value 301 of the voltage applied to the electric field-correcting electrode 201 is changed. Herein, the time delay of Δt is not required. Ina case where the voltage applied to the electric field-correcting electrode 201 and the voltage applied the vicinity of the electric field-correcting electrode 201 have different polarities, the absolute value of each applied voltage is set to be the maximum at the same time. In a case where the polarity is the same, the potential gradient between the electric field-correcting electrode 201 and the electrode in the vicinity of the electric field-correcting electrode 201 is made large. For example, when the absolute value of one applied voltage becomes maximum, the other applied voltage is controlled such that the absolute value of the other applied voltage becomes zero.

Thereafter, the dummy sample 203 is carried out (step S804). Incidentally, the voltage can be applied to the electrode in the vicinity of the electric field-correcting electrode for removing the foreign matter adhering to the electric field-correcting electrode 201 or the electric field-correcting electrode when the power source connected to each electrode is controlled by the foreign-matter removal control unit 122.

In the fifth embodiment, there is a risk that the potential gradient between the electric field-correcting electrode 201 and the electrode in the vicinity thereof is insufficient, and the foreign matter cannot be removed. In this embodiment, there is an advantage that the potential gradient between the electric field-correcting electrode 201 and the electrode in the vicinity thereof is increased, and the foreign matter adhering to the electric field-correcting electrode can be removed efficiently.

According to this embodiment, the same effect as that of the first embodiment can be obtained. In addition, the foreign matter can be removed more effectively from the electric field-correcting electrode by synchronizing the time change of the absolute value of the voltage applied to the electric field-correcting electrode 201 and the time change of the absolute value 701 of the voltage applied to the electrode in the vicinity of the electric field-correcting electrode.

Seventh Embodiment

The description will be given about a charged particle beam device according to a seventh embodiment of the invention. Incidentally, the matters which are described in the first to sixth embodiments and are not described in this embodiment may also be applied to this embodiment unless there are special circumstances.

Figure 11:
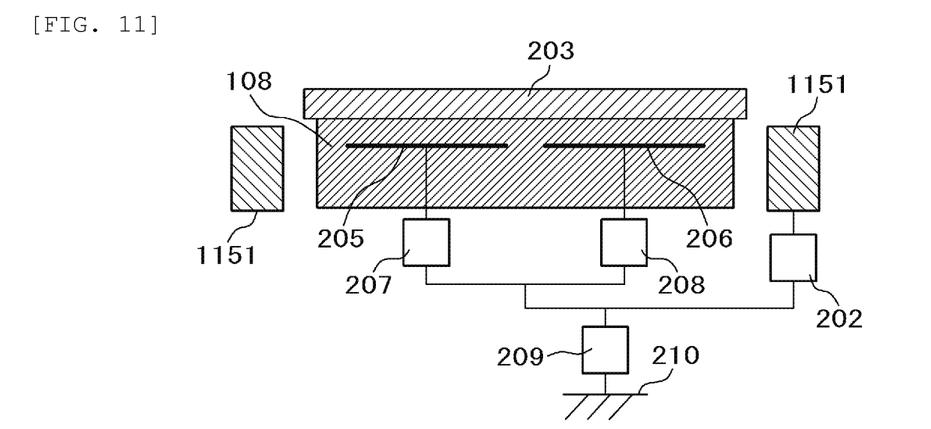
FIG. 11 is an enlarged sectional view of the electric field-correcting electrode and the vicinity thereof in a charged particle beam device according to a seventh embodiment of the invention.
Figure 12:
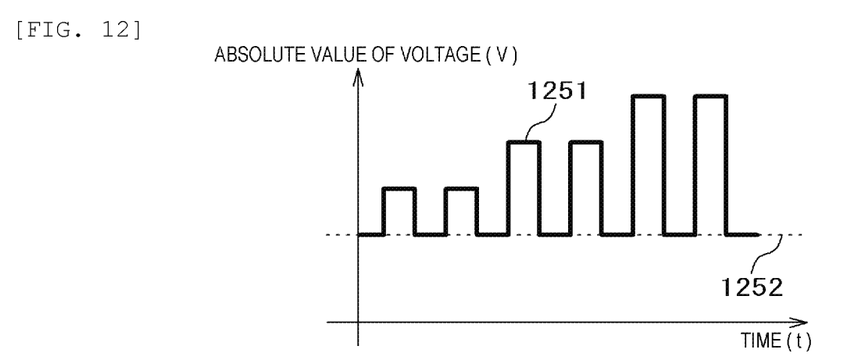
FIG. 12 is an explanatory diagram illustrating a time change of an absolute value of the voltage to be applied to the electric field-correcting electrode when the foreign matter is removed from the electric field-correcting electrode illustrated in FIG. 11.

In this embodiment, the description will be given about the configuration in which the foreign matter adhering to the electric field-correcting electrode is removed only when necessary. FIG. 11 is an enlarged sectional view of the configuration including the electric field-correcting electrode 201 and the sample stage 108 in the vicinity thereof in this embodiment. Incidentally, in FIG. 11, the same reference signs as those in FIG. 2 indicate the same or corresponding parts. Thus, the repetitive description thereof is not given. In this embodiment, the point of modification compared to the first embodiment is that the electric field-correcting electrode 1151 with a mirrored surface is used instead of the electric field-correcting electrode 201. FIG. 12 is an explanatory diagram illustrating a time change of an absolute value 1251 of the voltage to be applied to the electric field-correcting electrode 1151 with a mirrored surface when the foreign matter is removed from the electric field-correcting electrode with a mirrored surface illustrated in FIG. 11.

In this embodiment, in the configuration illustrated in FIG. 11, the power source connected to the electric field-correcting electrode 1151 with a mirrored surface is controlled by the foreign-matter removal control unit 122 such that the voltage is applied to the electric field-correcting electrode 1151 with a mirrored surface, and the foreign matter adhering to the electric field-correcting electrode 1151 with a mirrored surface is removed. Herein, the absolute value 1251 of the voltage applied to the electric field-correcting electrode 1151 with a mirrored surface is equal to or more than the maximum value 1252 of the absolute value of the voltage applied to the electric field-correcting electrode 1151 with a mirrored surface during the measurement. Further, it is desirable to exceed the maximum value. The applied voltage and the period can be set by the input/output unit 120 including the display unit. In addition, the voltage may be registered in the storage unit 121 in advance. In addition, with respect to the applied voltage, the maximum value of the absolute value of the voltage applied to the electric field-correcting electrode during the measurement may be recorded, and a voltage value obtained by adding a predetermined voltage to the value may be calculated and set in the control unit 111. In addition, the time change of the absolute value 1251 of the voltage applied to the electric field-correcting electrode 1151 with a mirrored surface which corresponds to FIG. 12 may be displayed on the display unit of the input/output unit 120.

The surface roughness of the electric field-correcting electrode 1151 with a mirrored surface is small. For example, the value of arithmetic average roughness Ra is 1 nm or less. By setting the surface roughness as above, the effective contact area between the foreign matter having several nanometers to several tens of microns of particle size and the electric field-correcting electrode 1151 with a mirrored surface is increased, and the adhering force of the foreign matter adhering to the electric field-correcting electrode 1151 with a mirrored surface is increased by the adhering force including van der Waals force. In the first to sixth embodiments, until the foreign matter is removed again from the electric field-correcting electrode after the foreign matter is removed from the electric field-correcting electrode once, the adhering force of the foreign matter adhering to the electric field-correcting electrode is small. Thus, during the measurement of the sample as a measurement target, the foreign matter may be scattered when the voltage is applied to the electric field-correcting electrode corresponding to the measurement position. In this embodiment, the adhering force of the foreign matter is improved. Thus, the foreign matter adhering to the electric field-correcting electrode is not scattered except when the voltage for removing the foreign matter is applied, the foreign matter can be prevented from adhering to the sample as a measurement target during the measurement, the scattering can be suppressed, the number of removing the foreign matter from the electric field-correcting electrode can be reduced, and throughput reduction can be suppressed, which are advantageous.

According to this embodiment, the same effect as that of the first embodiment can be obtained. In addition, by using the electric field-correcting electrode with a mirrored surface, it can be suppressed that the foreign matter is scattered from the electric field-correcting electrode during the measurement.

Eighth Embodiment

The description will be given about a charged particle beam device according to an eighth embodiment of the invention. Incidentally, the matters which are described in the first to seventh embodiments and are not described in this embodiment may also be applied to this embodiment unless there are special circumstances.

Figure 13:
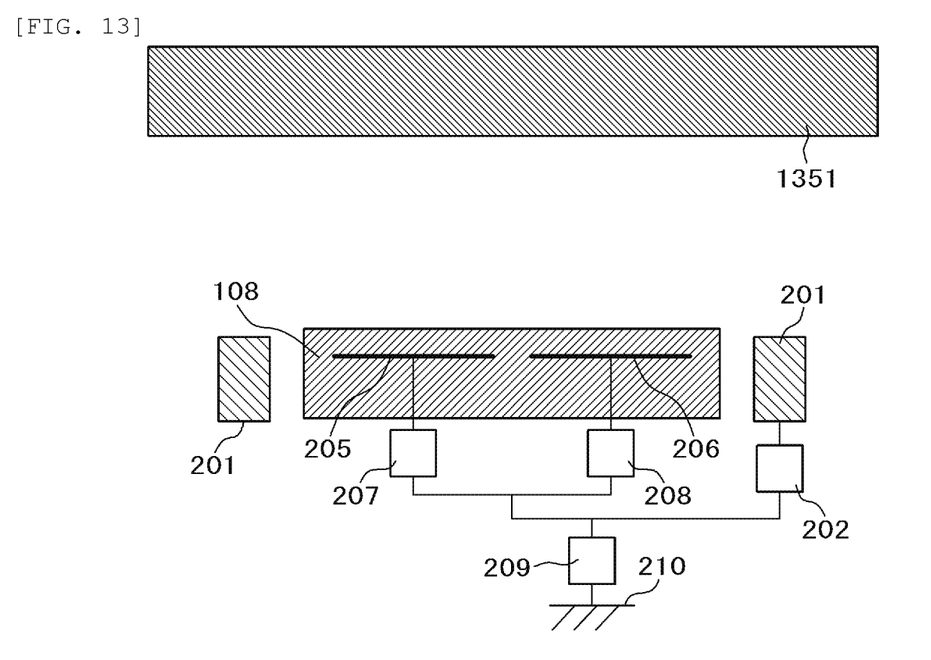
FIG. 13 is an enlarged sectional view of the electric field-correcting electrode and the vicinity thereof in a charged particle beam device according to an eighth embodiment of the invention.
Figure 14:
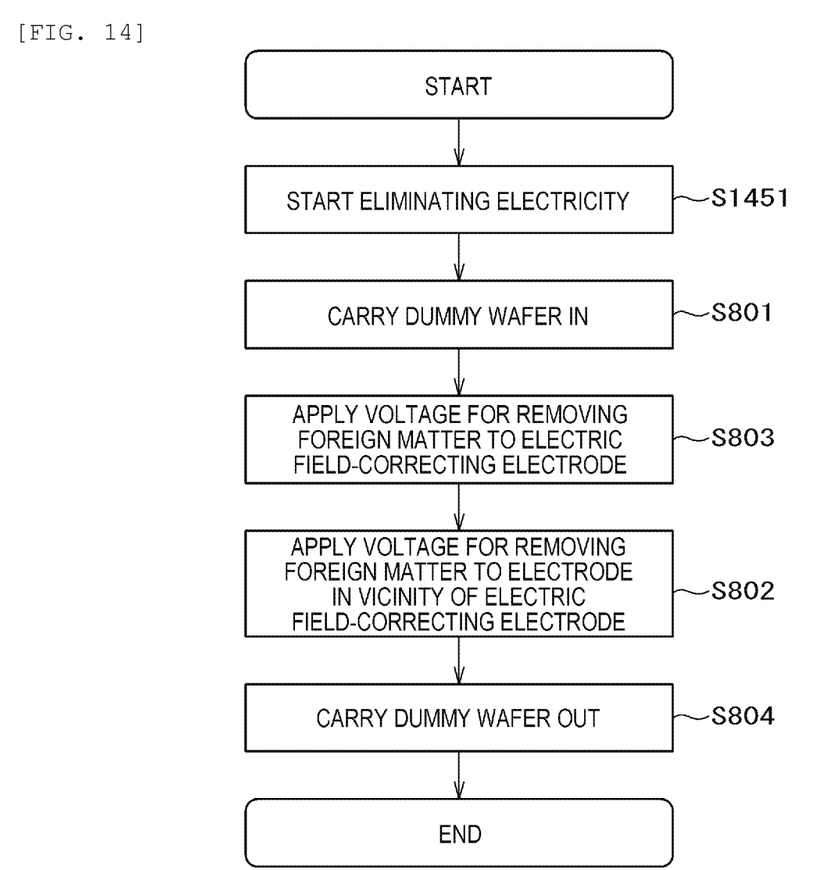
FIG. 14 is a flowchart showing a process of removing the foreign matter from the electric field-correcting electrode illustrated in FIG. 13.

In this embodiment, the description will be given about another configuration in which the foreign matter adhering to the electric field-correcting electrode is removed effectively. FIG. 13 is an enlarged sectional view of the configuration including the electric field-correcting electrode 201 and the sample stage 108 in the vicinity thereof in this embodiment. Incidentally, in FIG. 13, the same reference signs as those of the view referred to in the first to seventh embodiments indicate the same or corresponding parts. Thus, the repetitive description thereof is not given. In this embodiment, the point of modification compared to the first embodiment is that in a state where the dummy sample 203 is not held on the sample stage, the sample stage 108 and the electric field-correcting electrode 201 are arranged to be moved from the lower area of the objective lens 107 or the shield electrode 110 to the lower area of a static eliminator 1351 for eliminating static electricity on the adhering foreign matter. FIG. 14 is a flowchart showing a process of removing the foreign matter from the electric field-correcting electrode 201 in this embodiment by using the static eliminator as an auxiliary unit.

In a state where the dummy sample is not held on the sample stage, the sample stage is moved such that the electric field-correcting electrode 201 is included in the static elimination range of the static eliminator 1351, and the configuration is formed as illustrated in FIG. 13. Then, static electricity is eliminated on the surface of the electric field-correcting electrode 201 (step S1451). The operation of the static eliminator 1351 can be controlled by the control unit 111.

Next, the dummy sample (dummy wafer) 203 is carried in on the sample stage (step S801). Herein, the sample stage is moved such that the electrode in the vicinity of the electric field-correcting electrode 201 is arranged as illustrated in FIG. 6. Thereafter, the voltage for removing the foreign matter is applied to the electric field-correcting electrode 201 (step S803). Herein, for example, as illustrated in FIG. 9, the absolute value 301 of the voltage applied to the electric field-correcting electrode 201 in order to remove the foreign matter is equal to or more than the maximum value 302 of the absolute value of the voltage applied to the electric field-correcting electrode 201 during the measurement.

Next, the voltage for removing the foreign matter is applied to the electrode in the vicinity of the electric field-correcting electrode 201 (step S802). Herein, for example, as illustrated in FIG. 7, the time change of the absolute value 701 of the voltage applied to the electrode in the vicinity of the electric field-correcting electrode 201 in order to remove the foreign matter is periodical, and the value thereof is equal to or more than the maximum value 702 of the absolute value of the voltage applied to the electrode in the vicinity of the electric field-correcting electrode 201 during the measurement. Further, it is desirable to exceed the maximum value.

Further, the dummy sample 203 is carried out (step S804). Incidentally, the voltage can be applied to the electrode in the vicinity of the electric field-correcting electrode for removing the foreign matter adhering to the electric field-correcting electrode 201 or the electric field-correcting electrode when the power source connected to each electrode is controlled by the foreign-matter removal control unit 122.

In the first embodiment, depending on the charged state of the foreign matter adhering to the electric field-correcting electrode 201 and the applied voltage, the Coulomb force directed to the electric field-correcting electrode 201 acts on the foreign matter, and the foreign matter may not be removed. In this embodiment, when the charged state of the foreign matter is controlled by the static eliminator in advance, the foreign matter can be removed effectively, which is advantageous. In addition, in the fifth embodiment, the voltage for removing the foreign matter is applied to the electric field-correcting electrode 201 after the electrode in the vicinity of the electric field-correcting electrode 201. Thus, the foreign matter scattered from the electric field-correcting electrode 201 may remain adhering to the electrode in the vicinity of the electric field-correcting electrode 201. According to this embodiment, it can be suppressed that the foreign matter adheres to the electrode in the vicinity of the electric field-correcting electrode 201. Thus, the foreign matter is not scattered from the electrode in the vicinity of the electric field-correcting electrode 201 by the change of the applied voltage during the measurement, and the foreign matter can be prevented from adhering to the sample as a measurement target, which is advantageous.

In this embodiment, static electricity is eliminated before the dummy sample 203 is carried on the sample stage. However, static electricity may be eliminated after the dummy sample 203 is carried, and the voltage may be applied to the electric field-correcting electrode 201 to remove the foreign matter. In addition, static electricity may be eliminated while the voltage for removing the foreign matter is applied to the electric field-correcting electrode 201. Further, in this embodiment, a vacuum ultraviolet ray irradiation device is used as the static eliminator. However, an optical irradiation type static eliminator or an X ray irradiation type static eliminator may be used as well as the ultraviolet ray area.

According to this embodiment, the same effect as that of the first embodiment can be obtained. In addition, by using the static eliminator, the foreign matter adhering to the electric field-correcting electrode can be removed more effectively.

REFERENCE SIGNS LIST

101: electron gun
102: first condenser lens

103: aperture
104: second condenser lens
105: detector
106: scanning deflector
107: objective lens
108: sample stage
109: casing
110: shield electrode
111: control unit
120: input/output unit with display unit
121: storage unit
122: foreign-matter removal control unit
201: electric field-correcting electrode
202: electric field-correcting power source
203: sample not to be measured (dummy sample)
205, 206: electrostatic chuck electrode
207, 208: electrostatic chuck power source
209: retarding power source
210: ground
301: absolute value of voltage applied to electric field-correcting electrode during foreign matter removal
302: maximum value of absolute value of voltage applied to electric field-correcting electrode during measurement
701: absolute value of voltage applied to electrode in vicinity of electric field-correcting electrode during foreign matter removal
702: maximum value of absolute value of voltage applied to electrode in vicinity of electric field-correcting electrode during measurement
1151: electric field-correcting electrode with mirrored surface
1251: absolute value of voltage applied to electric field-correcting electrode with mirrored surface during foreign matter removal
1252: maximum value of absolute value of voltage applied to electric field-correcting electrode with mirrored surface during measurement
1351: static eliminator

The invention claimed is:

1. A charged particle beam device which includes a sample stage provided with a measurement sample and an electric field-correcting electrode which corrects an electric field in a vicinity of an outer peripheral portion of the measurement sample, and in which the measurement sample is measured by irradiating the measurement sample with a charged particle beam, the device comprising:
a memory;
an input/output device; and
a processor communicatively coupled to the memory and the input/output device, wherein the processor is configured to:
performs control such that when a dummy sample is provided in the sample stage or both the measurement sample and the dummy sample are not provided in the sample stage, a first voltage is applied to the electric field-correcting electrode and/or a second voltage is applied to a neighboring electrode arranged near the electric field-correcting electrode to remove a foreign matter adhering to the electric field-correcting electrode, and
control a power source connected to the electric field-correcting electrode and/or a power source connected to the neighboring electrode such that in the voltage to be applied to the electric field-correcting electrode, the first voltage and/or the second voltage have periodicity, or an absolute value of the first voltage and/or an absolute value of the second voltage is equal to or more than an absolute value of the voltage applied when the measurement sample is measured.

2. The charged particle beam device according to claim 1, wherein
the neighboring electrode is at least one of the dummy sample, an objective lens for the charged particle beam which is included in a charged particle beam optical system, a shield electrode which suppresses distortion of the electric field in the entire surface of the measurement sample, and an electrostatic chuck electrode which is arranged in the sample stage.

3. The charged particle beam device according to claim 1, wherein
the electric field-correcting electrode is arranged in an outer peripheral portion of the sample stage.

4. The charged particle beam device according to claim 1, wherein
a surface of the electric field-correcting electrode is a mirrored surface.

5. The charged particle beam device according to claim 1, wherein
the processor controls the power source connected to the electric field-correcting electrode and the power source connected to the neighboring electrode such that a change of the first voltage to be applied to the electric field-correcting electrode is changed synchronously with a change of the second voltage to be applied to the neighboring electrode.

6. The charged particle beam device according to claim 5, wherein
the processor controls the power source connected to the electric field-correcting electrode and/or the power source connected to the neighboring electrode such that a potential gradient of the electric field-correcting electrode and the neighboring electrode during foreign matter removal is larger than a potential gradient of the electric field-correcting electrode and the neighboring electrode during sample measurement.

7. The charged particle beam device according to claim 1, wherein
the processor controls a power source connected to the objective lens such that the second voltage is applied to the objective lens which is one of the neighboring electrodes.

8. The charged particle beam device according to claim 1 further comprising:
a static eliminator for eliminating static electricity on the foreign matter adhering to the electric field-correcting electrode.

9. The charged particle beam device according to claim 8, wherein
the static eliminator is auxiliary to the processor.

10. The charged particle beam device according to claim 8, wherein
the static eliminator is an optical irradiation static eliminator.

11. A charged particle beam device comprising:
a charged particle gun;
a sample stage which is provided with a measurement sample to be irradiated with a charged particle beam including a charged particle emitted from the charged particle gun;
an electric field-correcting electrode which is arranged in a periphery of the sample stage and corrects an electric field in a vicinity of an outer peripheral portion of the measurement sample;

a charged particle beam optical system for the charged particle beam which includes an objective lens;

a processor which controls each component; and a display which is connected to the processor, wherein the display displays a time change of a voltage having periodicity or a time change of an absolute value of a voltage which is equal to or more than an absolute value of a voltage to be applied when the measurement sample is measured, and to be applied to the electric field-correcting electrode when the foreign matter adhering to the electric field-correcting electrode is removed.

12. The charged particle beam device according to claim 11, wherein the display displays the time change of the voltage having periodicity and the absolute value of the voltage is equal to or more than the absolute value of the voltage to be applied when the measurement sample is measured, and to be applied to an electrode in the vicinity of the electric field-correcting electrode when the foreign matter adhering to the electric field-correcting electrode is removed.

13. A charged particle beam device comprising:

a charged particle gun;

a sample stage which is provided with a measurement sample to be irradiated with a charged particle beam including a charged particle emitted from the charged particle gun;

an electric field-correcting electrode which is arranged in a periphery of the sample stage;

a charged particle beam optical system for the charged particle beam which includes an objective lens;

a processor which controls each component; and a display which is connected to the processor, wherein the display displays a time change of a voltage having periodicity or a time change of an absolute value of a voltage which is equal to or more than an absolute value of a voltage to be applied when the measurement sample is measured, and to be applied to an electrode in the vicinity of the electric field-correcting electrode when the foreign matter adhering to the electric field-correcting electrode is removed.

14. The charged particle beam device according to claim 13, wherein the display displays the time change of the voltage having periodicity and the absolute value of the voltage is equal to or more than the absolute value of the voltage to be applied when the measurement sample is measured, and to be applied to an electrode in the vicinity of the electric field-correcting electrode when the foreign matter adhering to the electric field-correcting electrode is removed.

15. The charged particle beam device according to claim 13, wherein the charged particle beam optical system includes a shield electrode which suppresses distortion of an electric field in the entire surface of the measurement sample, the sample stage includes an installed dummy sample and an electrostatic chuck electrode for sucking the dummy sample, and the electrode in the vicinity of the electric field-correcting electrode is at least one of the dummy sample, the objective lens, a shield electrode, and the electrostatic chuck electrode.

* * * * *